US011526076B2

(12) United States Patent
Cone et al.

(10) Patent No.: US 11,526,076 B2
(45) Date of Patent: Dec. 13, 2022

(54) NANOFABRICATION SYSTEM WITH DISPENSING SYSTEM FOR ROTATIONAL DISPENSING

(71) Applicant: CANON KABUSHIKI KAISHA, Tokyo (JP)

(72) Inventors: Craig William Cone, Austin, TX (US); Qi Ni, Pflugerville, TX (US); Steven Wayne Burns, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/951,503

(22) Filed: Nov. 18, 2020

(65) Prior Publication Data

US 2022/0155677 A1    May 19, 2022

(51) Int. Cl.
*G03F 7/00* (2006.01)
*B05C 11/02* (2006.01)
(Continued)

(52) U.S. Cl.
CPC .............. *G03F 7/0002* (2013.01); *B05B 1/14* (2013.01); *B05B 3/02* (2013.01); *B05B 13/0228* (2013.01);
(Continued)

(58) Field of Classification Search
CPC ... B41J 3/28; B41J 3/407; B41J 25/003; B41J 29/38; B41J 2/01; B41J 3/36; B41J 3/4073; B41J 3/40731; B41J 3/40733; B41J 19/16; B41J 2/15; B41J 2/155; B41J 2/21; B41J 2/2103; B41J 2/525; B41J 2/16585; B41J 2/16588; B41J 2/2146; B41J 2/515; B41J 3/54; B41J 3/543; B41J 2002/16591;
(Continued)

(56) References Cited

U.S. PATENT DOCUMENTS 4,564,280 A    1/1986 Fukuda
5,571,560 A    11/1996 Lin
(Continued)

FOREIGN PATENT DOCUMENTS

JP    2002-82216    *    3/2002
JP    2005-181472    *    7/2005
JP    3680897 B2        8/2005

OTHER PUBLICATIONS

English Translation of JP2002-82216 published Mar. 22, 2002. (Year: 2002).*
(Continued)

*Primary Examiner* — Laura Edwards
(74) *Attorney, Agent, or Firm* — Canon U.S.A., Inc., IP Division

(57) ABSTRACT

A dispensing system comprises a first dispenser and a second dispenser each including a first end, a second end, a longitudinal axis extending through the first end and the second end, and a set of nozzles arranged about the longitudinal axis. The first dispenser is positioned relative to the second dispenser such that the longitudinal axis of the first dispenser is non-coaxial with the longitudinal axis of the second dispenser. The dispensing system also comprises a substrate chuck configured to hold a substrate and a rotation mechanism configured to rotate the substrate chuck around a rotation axis or configured to rotate the first dispenser and the second dispenser around the rotation axis.

19 Claims, 9 Drawing Sheets

(51) Int. Cl.
*B05C 5/02* (2006.01)
*B05B 13/02* (2006.01)
*B05B 3/02* (2006.01)
*B05B 1/14* (2006.01)
*B05C 11/08* (2006.01)

(52) U.S. Cl.
CPC ............ *B05C 5/027* (2013.01); *B05C 11/023* (2013.01); *B05C 11/08* (2013.01)

(58) Field of Classification Search
CPC .... B41J 2202/20; B41J 2202/21; B41J 2/145; H01L 21/67051; H01L 21/6715; H01L 21/02; H01L 21/302; G02B 5/201; G02F 1/133516; B05B 1/02; B05B 3/02; B05B 17/0607; B05B 13/0228; B05B 1/14; B05C 5/027; B05C 11/023; B05C 11/08; B05C 5/0291; B05C 9/12; B05C 9/14; B05D 1/005; B05D 1/26; G03F 7/0002
USPC ....................................................... 118/313
See application file for complete search history.

(56) References Cited

U.S. PATENT DOCUMENTS

| | | | |
|---|---|---|---|
| 5,935,331 | A | 8/1999 | Naka |
| 6,502,920 | B1* | 1/2003 | Anderson ............ B41J 2/04543 |
| | | | 347/40 |
| 6,527,861 | B2 | 3/2003 | Takekuma |
| 6,551,765 | B1 | 4/2003 | Mukai |
| 9,539,589 | B2 | 1/2017 | Araki |
| 10,391,763 | B2 | 8/2019 | Verheijen |
| 2008/0186354 | A1 | 8/2008 | White |
| 2012/0188299 | A1 | 7/2012 | Seki |
| 2017/0333940 | A1* | 11/2017 | Sreenivasan ........ B81C 1/00611 |

OTHER PUBLICATIONS

English Translation of JP2005-181472, Akira, published Jul. 7, 2005. (Year: 2005).*

* cited by examiner

NANOFABRICATION SYSTEM WITH DISPENSING SYSTEM FOR ROTATIONAL DISPENSING

BACKGROUND

Field of Art

The present disclosure relates to a nanofabrication system having a dispensing system for rotational dispensing.

Description of the Related Art

Nanofabrication includes the fabrication of very small structures that have features on the order of 100 nanometers or smaller. One application in which nanofabrication has had a sizeable impact is in the fabrication of integrated circuits. The semiconductor processing industry continues to strive for larger production yields while increasing the circuits per unit area formed on a substrate. Improvements in nanofabrication include providing greater process control and/or improving throughput while also allowing continued reduction of the minimum feature dimensions of the structures formed.

Nanofabrication techniques include, for example, nanoimprinting and planarization. Nanoimprinting is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, and the like. The nanoimprinting technique may generally include the shaping of a film on a substrate by the formation of a relief pattern in a formable material (polymerizable) layer. The shape of this film may then be used to transfer a pattern corresponding to the relief pattern into and/or onto an underlying substrate. The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

Planarization techniques are particularly useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In conjunction with nanoimprinting, planarization improves feature filling and CD control after pattern transfer.

In certain known imprint/planarization systems and methods, the formable material is dispensed onto a substrate by linearly translating either the substrate relative to the dispenser or the dispenser relative to the substrate such that the dispenser is able to dispense formable material across one end of the substrate to the opposite end of the substrate. However, in order to cover the entire surface area of the substrate, either many dispensers are needed (e.g., six or more dispensers) or many passes of the dispenser/substrate relative to the other are needed (e.g., five to ten or more passes). Many dispensers creates structural difficulties with respect to physically mounting the dispensers, while many passes greatly increases the dispensing time. Therefore, there is a need in the art for a dispensing system that both avoids the structural difficulty of many dispensers and avoids the dispensing time increase of many passes.

SUMMARY

A dispensing system comprises a first dispenser including a first end, a second end, a longitudinal axis extending through the first end of the first dispenser and the second end of the first dispenser, and a set of nozzles arranged about the longitudinal axis of the first dispenser, a second dispenser including a first end, a second end, a longitudinal axis extending through the first end of the second dispenser and the second end of the second dispenser, and a set of nozzles arranged about the longitudinal axis of the second dispenser, a substrate chuck configured to hold a substrate, and a rotation mechanism configured to rotate the substrate chuck around a rotation axis or configured to rotate the first dispenser and the second dispenser around the rotation axis, wherein the first dispenser is positioned relative to the second dispenser such that the longitudinal axis of the first dispenser is non-coaxial with the longitudinal axis of the second dispenser.

A nanofabrication system comprises a substrate chuck configured to hold a substrate, a superstrate or a template, a positioning stage, a dispensing system configured to dispense formable material on the substrate, the dispensing system comprising: a first dispenser including a first end, a second end, a longitudinal axis extending through the first end of the first dispenser and the second end of the first dispenser, and a set of nozzles arranged about the longitudinal axis of the first dispenser, a second dispenser including a first end, a second end, a longitudinal axis extending through the first end of the second dispenser and the second end of the second dispenser, and a set of nozzles arranged about the longitudinal axis of the second dispenser, wherein the first dispenser is positioned relative to the second dispenser such that the longitudinal axis of the first dispenser is non-coaxial with the longitudinal axis of the second dispenser, a rotation mechanism configured to rotate the substrate chuck around a rotation axis or configured to rotate the first dispenser and the second dispenser around the rotation axis during dispensing of the formable material, a positioning system configured to contact the formable material with the superstrate or template, and a curing system configured to cure the formable material under the superstrate or template so as to form cured formable material on the substrate.

A method of manufacturing an article comprises dispensing a formable material onto a substrate using a dispensing system, the dispensing system comprising: a first dispenser including a first end, a second end, a longitudinal axis extending through the first end of the first dispenser and the second end of the first dispenser, and a set of nozzles arranged about the longitudinal axis of the first dispenser, a second dispenser including a first end, a second end, a longitudinal axis extending through the first end of the second dispenser and the second end of the second dispenser, and a set of nozzles arranged about the longitudinal axis of the second dispenser, wherein the first dispenser is positioned relative to the second dispenser such that the longitudinal axis of the first dispenser is non-coaxial with the longitudinal axis of the second dispenser, during the dispensing, rotating a substrate chuck holding the substrate around a rotation axis or rotating the first dispenser and the second dispenser around the rotation axis, contacting a superstrate or template with the formable material dispensed on the substrate, curing the formable material, separating the superstrate or template from the cured formable material, and processing the cured formable material to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Figure 1:
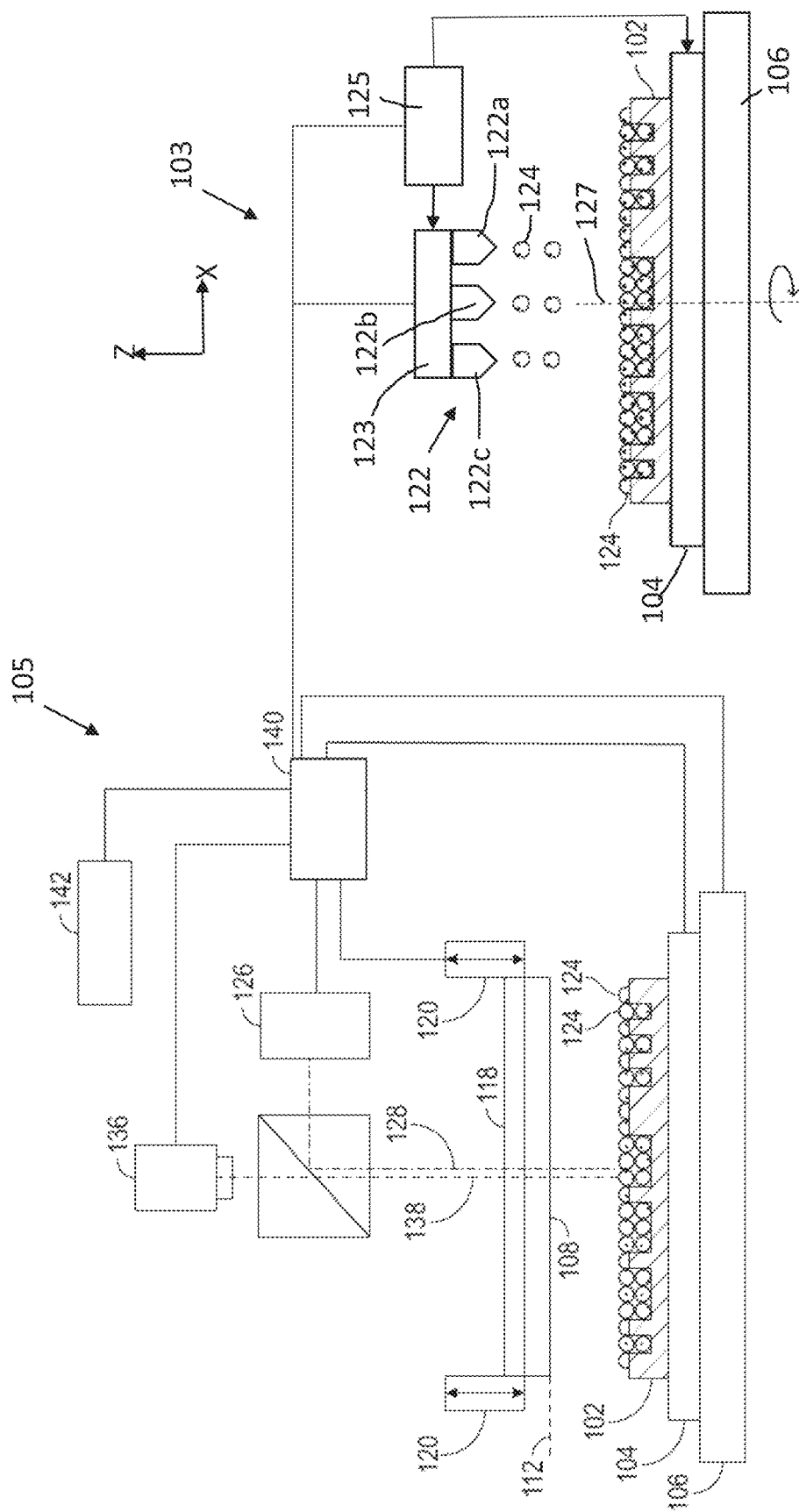
FIG. 1 is an illustration of an exemplary planarization system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to planarization, which uses a patternless superstrate to form a planar surface onto formable liquid. However, in an alternative embodiment, a patterned template is used to impart a pattern onto formable liquid. In such embodiments where a pattern is imparted using a patterned template, the formation process is referred to as nanoimprinting. Thus, throughout this disclosure, whenever planarization is mentioned, it should be understood that a corresponding method is applicable to nanoimprinting. The term template is used in place of the term superstrate in instances where the template is patterned.

Planarization/Nanoimprint System

FIG. 1 illustrates a schematic example of a planarization system 100 in accordance with an aspect of the present disclosure. The planarization system 100 is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage 106 may be a part of a positioning system.

As shown in FIG. 1, in an example embodiment, the planarization system 100 may include two separate systems: a dispensing system 103 and a planarizing system 105. The two systems may be located at different locations. The stage 106 may be capable of travelling along a rail (not shown) to carry the substrate 102 to each of the two systems. In another example embodiment, the substrate 102 and substrate chuck 104 may be carried to the various systems via a robot arm. As shown in FIG. 1, the planarizing system 105 may also include curing features for curing formable material, which is discussed in more detail below. However, in another embodiment, the curing features may be part of a separate curing system located at a third location different from the locations of the dispensing system 103 and the planarizing system 105.

The dispensing system 103 may generally comprise a plurality of fluid dispensers 122 mounted to a dispenser head 123, shown schematically in in FIG. 1 without illustrating a particular orientation relative to each other or relative to the substrate 102. The orientation of the plurality of fluid dispensers 122 relative to each other and to the substrate 102 is discussed in more detail below with respect to FIGS. 3 and 4. The plurality of fluid dispensers 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids. As shown in FIG. 1, the dispensing system 103 may further include a rotation mechanism 125 configured to rotate the substrate chuck 104 around a rotation axis 127 or configured to rotate the plurality of dispensers 122 around the rotation axis 127. The rotation mechanism 125 may be a rotation stage (also known as a rotary stage) with integrated goniometer. The rotation mechanism may have a relatively slow spin rate (e.g., three hertz or less). The rotation mechanism may have a minimum incremental motion/linearity of 150 to 250 μrad. One example rotation mechanism is the U-651 Rotation Stage with Low-Profile Design by PI (Physik Instrumente) L.P.

In another embodiment, in the context of a nanoimprinting system, all the above-described elements are also present in a nanoimprinting system, except that the planarizing system would be a nanoimprinting system.

As shown in FIG. 1, the planarizing system 105 of the planarization system 100 may comprise a superstrate 108 having a working surface 112 facing and spaced apart from the substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is readily transparent to UV light radiation. The surface 112 is generally of the same areal size as or slightly larger than the surface of the substrate 102. In an embodiment of a nanoimprint system, the surface 112 is a patterned surface in which case patterned surface is formed on the substrate. In a nanoimprinting embodiment, the superstrate would instead be a template and the surface would be a patterned surface.

The planarizing system 105 may further include a superstrate chuck 118 and a planarization head 120 which is part of the positioning system. The superstrate 108 may be coupled to or retained by the superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck 118 is likewise readily transparent to UV light. The superstrate chuck 118 may include a system such as a zone based vacuum chuck, an actuator array, a pressure bladder, etc., which can apply a pressure differential to a back surface of the superstrate 108 to cause the template to bend and deform. In one embodiment, the superstrate chuck 118 includes a zone based vacuum chuck which can apply a pressure differential to a back surface of the superstrate, causing the superstrate to bend and deform.

The superstrate chuck 118 may be coupled to the planarization head 120. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis). In operation, either the planarization head 120, the substrate positioning stage 106, or both vary a distance between the superstrate 108 and the substrate 102 to define a desired space (a bounded physical extent in three dimensions) that is filled with the formable material 124. For example, the planarization head 120 may be moved toward the substrate and may apply a force to the superstrate 108 such that the superstrate contacts and spreads droplets of the formable material 124 as further detailed herein. In a nanoimprinting embodiment, the superstrate chuck would instead be a template chuck and the planarization head would be an imprint head. The above-described function of each would be the same.

The planarization system 100 may further comprise a curing system that includes a radiation source 126 that directs actinic energy, for example, UV radiation, along an exposure path 128. The planarization head 120 and the substrate positioning state 106 may be configured to position the superstrate 108 and the substrate 102 in superimposition with the exposure path 128. The radiation source 126 sends the actinic energy along the exposure path 128 after the superstrate 108 has contacted the formable material 128. FIG. 1 illustrates the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124. As shown in FIG. 1, the curing system may be part of the planarizing system 105. However, in another example embodiment, the curing system may be separate from the planarizing system 105 located at a separate location from the dispensing system 103 and the planarizing system 105.

The planarizing system 105 may further comprise a camera 136 positioned to view the spread of formable material 124 as the superstrate 108 contacts the formable material 124 during the planarizing process. FIG. 1 illustrates an optical axis 138 of the field camera's imaging field. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

In another example embodiment, the dispensing system 103 and the planarizing system 105 may be integrated at a single location. In such an embodiment, the plurality of dispensers 122 may be movably coupled to the bridge. In an embodiment, the plurality of dispensers 122 and the planarization head 120 share one or more of all positioning components. In an alternative embodiment, the plurality of dispensers 122 and the planarization head move independently from each other. When the dispensing system 103 and the planarizing system 105 are integrated at a single location, the plurality of dispensers 122 and the planarization head 120 are moveable so that each can perform their respective functions without interfering with each other.

The planarization system 100 may be regulated, controlled, and/or directed by one or more processors 140 (controller) in communication with one or more components and/or subsystems such as the substrate chuck 104, the substrate positioning stage 106, the superstrate chuck 118, the plurality of dispensers 122, the rotation mechanism 125, the planarization head 120, the camera 136, and/or the radiation source 126. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140. The curing system and the controllers may be the same in a nanoimprint system.

Figure 2A:
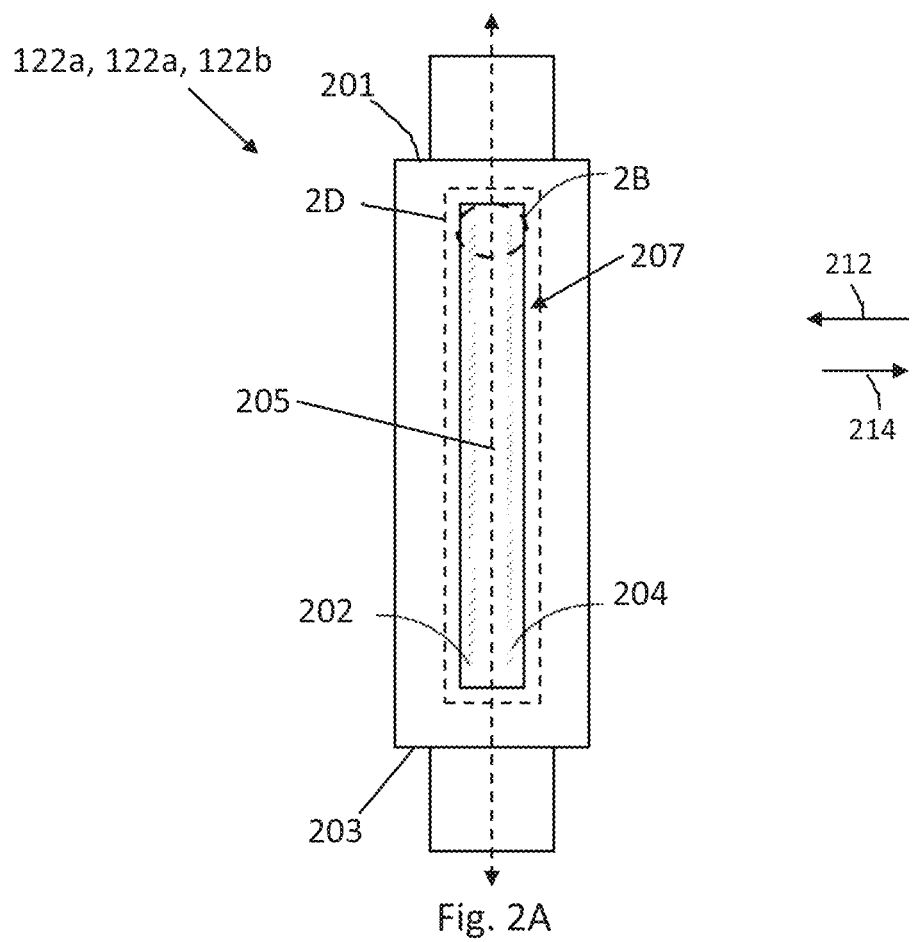
FIG. 2A is a bottom view of a dispenser in accordance with an example embodiment.

FIG. 2A is a bottom view of an example of a first fluid dispenser 122a, a second fluid dispenser 122b, and a third fluid dispenser 122c of the plurality of fluid dispensers 122. Only one fluid dispenser is shown because each fluid dispenser preferably has identical structure. Each fluid dispenser 122a, 122b, 122c may have a first end 201, a second end 203, and a longitudinal axis 205 extending through the first end 201 and the second end 203. The longitudinal axis 205 may be a center line, i.e., bisecting the fluid dispenser 122a, 122b, 122c into two equal halves. As shown in FIG. 2A, each fluid dispenser 122a, 122b, 122c may include a set of nozzles 207 arranged about the longitudinal axis 205. The set of nozzles 207 may include a first row of nozzles 202 and a second row of nozzles 204, where the first row of nozzles 202 and the second row of nozzles 204 are disposed on opposite sides of the longitudinal axis 205. Each row of nozzles 202, 204 includes many nozzles, such as hundreds of nozzles. For example each row of nozzles 202, 204 may include over 500 nozzles.

Figure 2B:
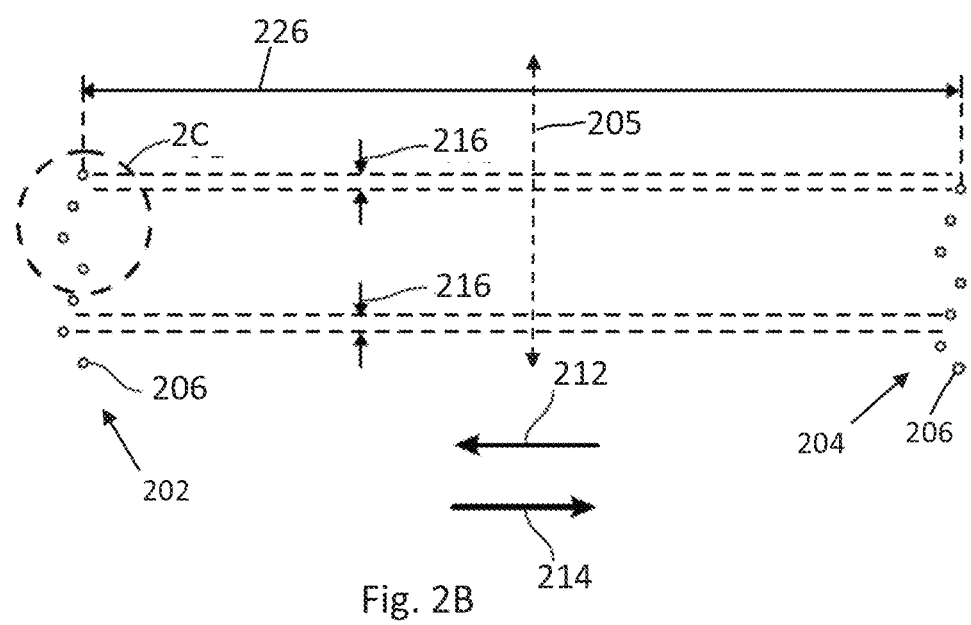
FIG. 2B is an enlarged portion 2B of the dispenser of FIG. 2A in accordance with an example embodiment.
Figure 2C:
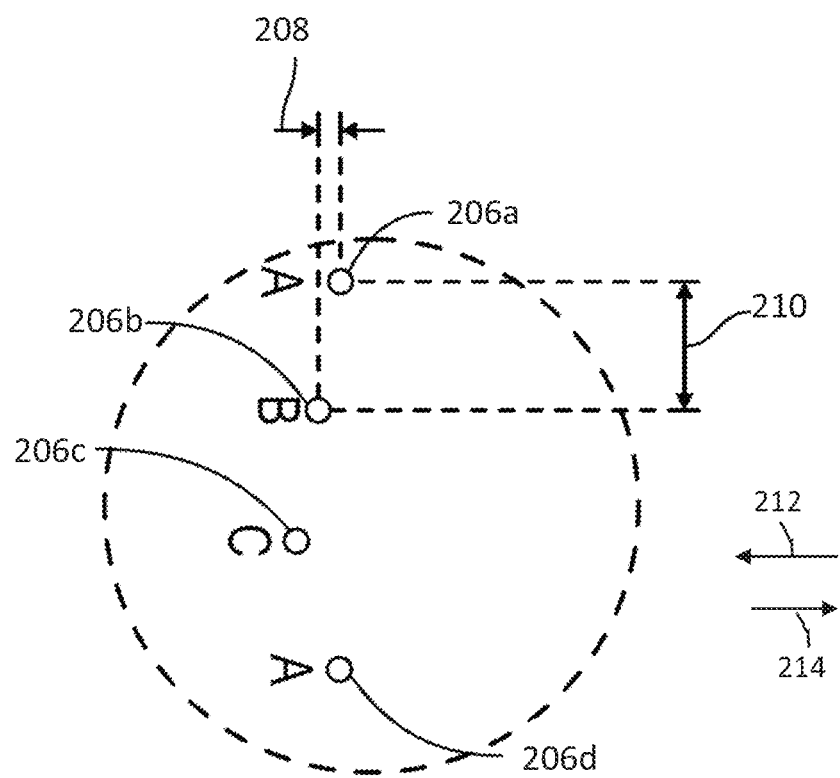
FIG. 2C is an enlarged portion 2C of the dispenser of FIG. 2B in accordance with an example embodiment.

FIG. 2B is an enlarged portion 2B of FIG. 2A and FIG. 2C is an enlarged portion 2C of FIG. 2B. FIG. 2B shows an enlarged portion of the first row of nozzles 202 and the second row of nozzles 204, such that a plurality of individual nozzles 206 are visible. FIG. 2C shows an enlarged portion of the first row of nozzles 202 only so that individual nozzles 206a, 206b, 206c, and 206d are visible. As referred herein, the "first nozzle" of each row is the topmost nozzle in Y-dimension in the orientation shown in FIG. 2B. The "second nozzle" is the adjacent nozzle appearing immediately below the first nozzle in the orientation shown in FIG. 2B. The same is applicable for the third, fourth, fifth, etc. nozzle. As referred herein, a "corresponding nozzle" means the nozzle number is the same in each row. That is, the first nozzle of the first row of nozzles corresponds to the first nozzle of the second row of nozzles, while the second nozzle of the first row of nozzles corresponds to the second nozzle of the second row of nozzles, and so on.

The X-dimension distance 208 between adjacent nozzles within the row of nozzles is best show in FIG. 2C. As seen in FIG. 2C, adjacent nozzles are offset by the X-dimension distance 208 in sets of three. That is, the nozzles are progressively offset in the X-dimension along a first X-direction 212 for three consecutive nozzles. The fourth nozzle in the row returns to the same X-dimension position as the first nozzle. Thus, the nozzle 206b is offset by the X-dimension distance 208 in the first X-direction 212 relative to the nozzle 206a, while the nozzle 206c is offset by the X-dimension nozzle 208 in the first X-direction 212 relative to the nozzle 206c. However, as seen in FIG. 2C, the nozzle 206d (i.e., the fourth nozzle in the row) has the same X-dimension position as the nozzle 206a (i.e., the first nozzle in the row). In other words, the nozzle 206c is offset relative to the nozzle 206b by the X-dimension distance 208 in a second X-direction 214 that is the opposite direction to the first X-dimension 212. Thus, the nozzle 206c is offset by two times the X-dimension distance 208 in the first X-direction 212 relative to the nozzle 206a and is also offset by two times the X-dimension distance 208 in the first X-direction 212 relative to the nozzle 206d. Likewise, the nozzle 206a and the nozzle 206d has the same X-dimension offset. The same pattern holds for the entire row of nozzles where the pattern repeats after every third nozzle such that the fourth nozzle has the same X-dimension offset as the first nozzle. This pattern of every third nozzle having the same X-dimension position may be referred to as an "A, B, C" repeating pattern, where every "A" nozzle is in same X-dimension position as all other "A" nozzles, every "B" nozzle is in the same X-dimension position as all other "C" nozzles, and every "C" nozzle is in the same X-dimension position as all other "C" nozzles.

The Y-dimension distance 210 between adjacent nozzles within the row of nozzles is best shown in FIG. 2C. As seen in FIG. 2C, the Y-dimension distance 210 between adjacent nozzles is constant throughout the entire row of nozzles. That is, the Y-dimension 210 has the same value for any two adjacent nozzles selected at any point within the row of nozzles. For example, the distance between nozzle 206a and 206b in the Y-dimension is the same as the distance between the nozzle 206b and 206c in the Y-dimension. The same holds true for every adjacent nozzle within each row of nozzles from the first nozzle to the last nozzle.

Returning to the FIG. 2B, the same nozzle layout of the first row of nozzles 202 is present in the second row of nozzles 204. That is, the second row of nozzles 204 similarly starts with a nozzle at a first X-dimension and Y-dimension location, with each adjacent nozzle having the same Y-dimension offset between adjacent nozzles throughout the entire row. The Y-dimension offset between adjacent nozzles in the second row of nozzles 204 is the same as the Y-dimension offset between adjacent nozzles in the first row of nozzles 202. Similarly, the second row of nozzles 204 includes the same pattern of the X-dimension distance in sets of three. Thus, the second nozzle is offset by one X-dimension distance 208 relative to the first nozzle, and third nozzle is offset by the X-dimension distance 208 relative to the second nozzle. But the third nozzle is offset by two times the X-dimension distance 208 relative to the first nozzle. Likewise, the fourth nozzle of the second row of nozzles 204 returns to the same X-dimension position as the first nozzle of the second row of nozzles 204. Thus, as with the first row of nozzles 202, every third nozzle of the second row of nozzles 404 has the same X-dimension position.

However, the second row of nozzles 204 differs from the first row of nozzles 202 in that the Y-dimension position of the first nozzle of second row of nozzles 204 is offset relative to the first nozzle of the first row of nozzles 202. Specifically, as shown in FIG. 2B, the first nozzle of the second row of nozzles 204 is offset, relative to the Y-dimension location of the first nozzle 206a of the first row of nozzles 202, in the Y-dimension, by a distance 216 that is one-half of the distance between adjacent nozzles in the Y-dimension (i.e., the distance 216 is one-half of the distance 210 between adjacent nozzles). Because each adjacent nozzle of the second row of nozzles 204 is spaced apart by the same Y-dimension distance 210 as the first row of nozzles 202, and because the first nozzle of the second row of nozzles is offset by a distance 216 that is one-half the distance 210 relative to the first nozzle of the first row of nozzles, every nozzle of the second row of nozzles 204 is also offset by the distance 216 relative to the corresponding nozzle in the first row of nozzles 202. That is, the second nozzle of the second row of nozzles 204 is offset by one-half distance 216 relative to the second nozzle 206b of the first row of nozzles 202, the third nozzle of the second row of nozzles 204 is offset by one-half distance 216 relative to the third nozzle 206c of the first row of nozzles 202, and so on. In other words, if one were to superimpose the second row of nozzles 204 onto the first row of nozzles 202, each nozzle of the second row of nozzles 204 would be located halfway between two nozzles of the first row of nozzles 202 in the Y-dimension. Furthermore, as seen in FIG. 2B, the second row of nozzles 204 is located at a distance 226 from the first row of nozzles 202 along the X-dimension.

As noted above, each row of nozzles 202, 204 may include over 500 nozzles. In one example embodiment, 500 nozzles of each row may be available during a dispensing operation with the remaining nozzles not being available for dispensing via control by the controller 140. For example, in each row of nozzles, the first 1 to 10 (i.e., on the first end 201 side), preferably 2 to 5 nozzles, are not used and the last 1 to 10 (i.e., on the second end 203 side), preferably 2 to 5 nozzles, are not used, with all of the nozzles in between being used during a dispensing operation. The first and second row of nozzles 202, 204 may each have the same overall number of nozzles and the controller 140 may control the each of the dispenses such that the same number of nozzles are used and the same number of nozzles are unused.

Figure 2D:
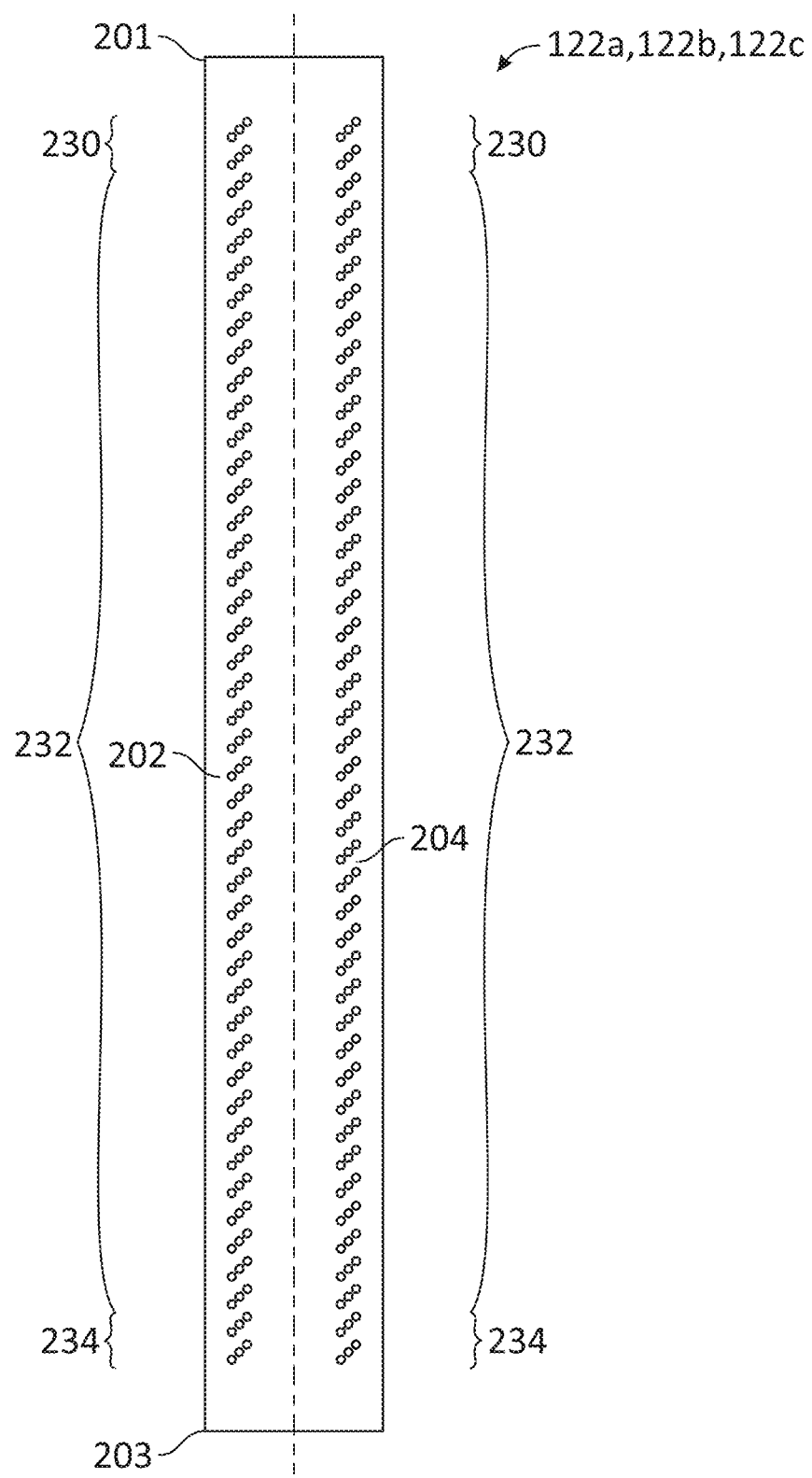
FIG. 2D is an enlarged portion 2D of the dispenser of FIG. 2A in accordance with an example embodiment.

FIG. 2D is an enlarged portion 2D of FIG. 2A. FIG. 2D illustrates an example embodiment where the rows of nozzles 202, 204 haven been divided into subsets of nozzles that will be controlled by the controller 140 to dispense fluid and subsets of nozzles that will be controlled by the controller 140 to not dispense fluid during ad dispensing operation. As shown in FIG. 2D, each dispenser 122a, 122b, 122c may include a first subset of nozzles 230, a second subset of nozzles 232, and a third subset of nozzles 234. The first subset of nozzles 230 are closest to the first end 201 relative to the other subset of nozzles, the third subset of nozzles 234 are closest to second end 203 relative to the other subsets of nozzles, and the second subset of nozzles 232 are between the first subset of nozzles 230 and the third set of nozzles 234. The first subset of nozzles 230 and the third subset of nozzles 234 are those nozzles that are those nozzles that are controlled by the controller 140 to not dispense fluid during a dispensing operation, while the second subset of nozzles 232 are those nozzles that are controlled by the controller 140 to dispense fluid during a dispensing operation. A ratio of a number of nozzles of the first subset of nozzles 230 to a number of nozzles of the second subset of nozzles 232 may be 1:40 to 1:60, for example 1:50. A ratio of a number of nozzles of the third subset of nozzles 234 to a number of nozzles of the second subset of nozzles 232 may be the same.

Figure 2E:
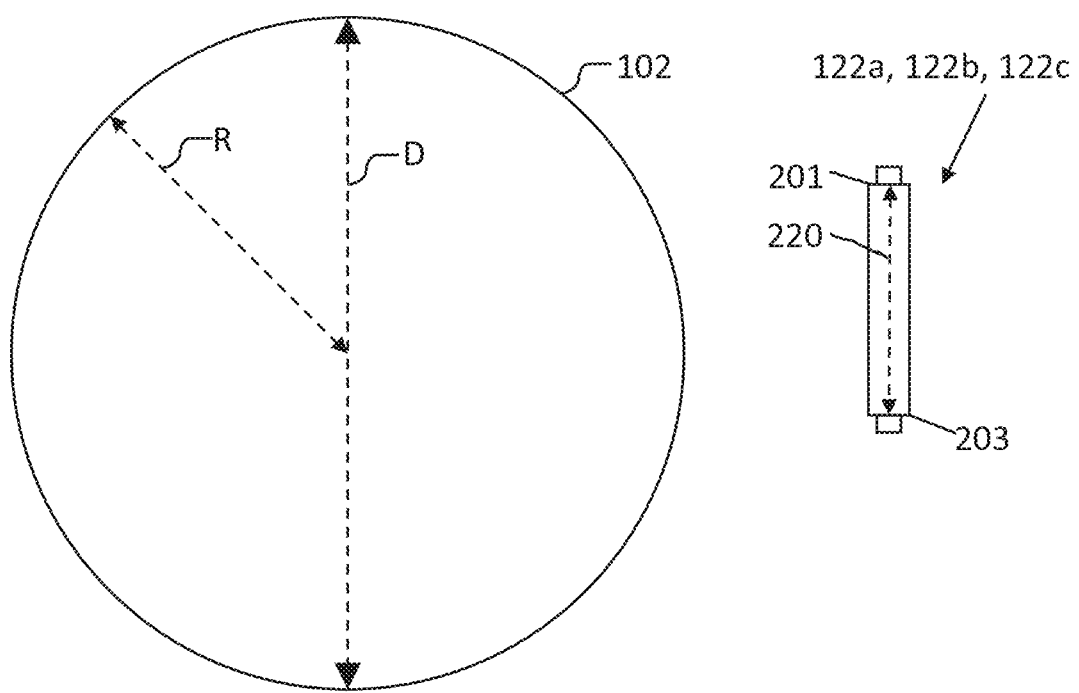
FIG. 2E shows schematic top view of the dispenser of FIG. 2A alongside a substrate in accordance with an example embodiment.

FIG. 2E shows schematic top view of the first dispenser 122a alongside an example substrate 102. In an example embodiment, the substrate 102 is several times larger than each dispenser 122a, 122b, 122c. For example, the substrate 102 may have a circular shape with a diameter D (radius R), where the diameter D is several times longer than a length 220 of the first dispenser 122a. The length L may be defined as the distance between the first end 201 and the second end 203. The ratio of the diameter of D of the substrate 102 to the length L 220 of each dispenser 122a, 122b, 122c may be 5:1 to 2:1 or 4:1 to 3:1 for example. Thus, as shown in FIG. 2E when the ratio of the diameter of the substrate 102 to the length of each dispenser 122a, 122b, 122c is within the above ranges, more than one dispenser is needed to span the surface area of the substrate during a rotational dispensing.

Figure 3:
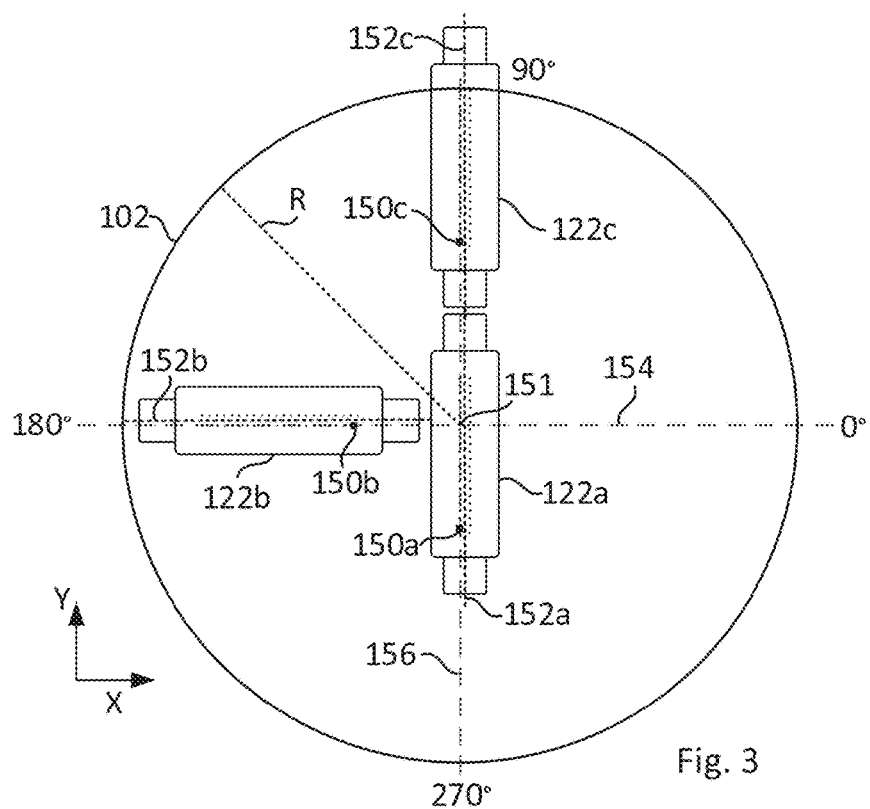
FIG. 3 shows a schematic plan view of a first example embodiment of a plurality of dispensers of FIG. 1 arranged relative to a substrate.
Figure 4:
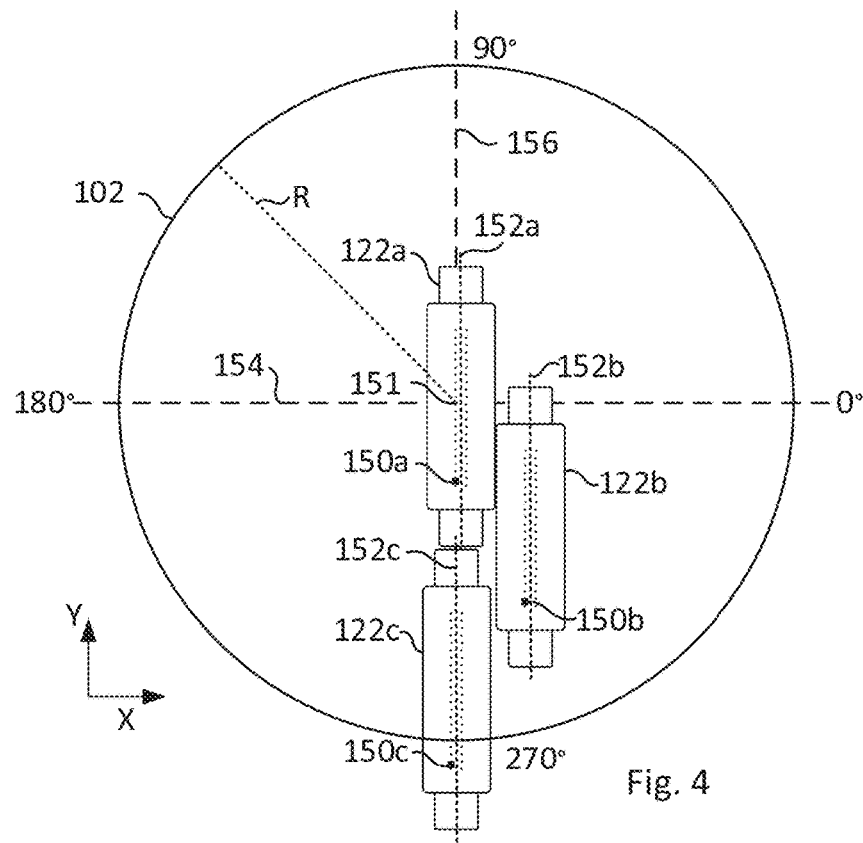
FIG. 4 shows a schematic plan view of a second example embodiment of the plurality of dispensers of FIG. 1 arranged relative to a substrate.

FIG. 3 shows a schematic plan view of a first example embodiment of the plurality of dispensers 122 arranged relative to the substrate 102. FIG. 4 shows a schematic plan view of a second example embodiment of the plurality of dispensers 122 arranged relative to the substrate 102.

In the example embodiment of FIG. 3, the plurality of dispensers 122 includes the first dispenser 122a, the second dispenser 122b, and the third dispenser 122c. Each of the dispensers 122a, 122b, 122c are mounted on the dispenser head 123 and oriented above the substrate 102 at particular positions relative to each other and relative to the center point 151 of the substrate 102. That is, while FIG. 3 shows a schematic plan view in two dimensions (X-Y), the dispensers 122a, 122b, 122c are located above the substrate 102 in a third dimension (Z). The relative position of each dispenser 122a, 122b, 122c relative to the surface of the substrate 102 is defined herein with respect to the location of a reference nozzle and the angle of the longitudinal axis relative to the vertical axis 156 and horizontal axis 154 of the substrate 102. As noted above, each of the dispensers 122a, 122b, 122c may have identical structure, which is the case in the embodiment of FIGS. 3 and 4. Thus, each of the dispensers 122a, 122b, 122c have identical number of nozzles in identical positions about their respective longitudinal axes. Accordingly, the position of each dispenser can be defined relative to the center 151 of the substrate 102 by a common reference point (i.e., a reference nozzle) and the angle of the longitudinal axis relative to the vertical axis and the horizontal axis of the substrate 102.

As shown in FIG. 3, each of the dispensers 122a, 122b, 122c have a reference nozzle 150a, 150b, 150c, and a longitudinal axis 152a, 152b, 152c. The reference nozzles 150a, 150b, 150c are each located in the same relative nozzle location within the row of nozzles in the respective dispenser. For example, if the reference nozzle is the thirteenth nozzle closest to the second end 203 in the first row of nozzles 202, then all of the reference nozzles 150a, 150b, 150c are the thirteenth nozzle closest to the second end 203 of the first row of nozzles 202 in each dispenser 122a, 122b, 122c. Any nozzle can be chosen as the reference nozzle for the purposes of defining the position of the dispensers relative to the substrate, as long as the same corresponding nozzle is used as the reference nozzle for all the dispensers. In the example embodiment shown in FIG. 3, the reference nozzles 150a, 150b, 150c are each the nozzle of the first row of nozzles 202, within the second subset of nozzles 232 that is closest to the second end 203. In other words, each reference nozzle 150a, 150b, 150c in the example embodiment is the thirteenth nozzle closest to the second end 203 that is also configured to dispense fluid, i.e., an active nozzle close to the second end 203. In an example embodiment, the thirteenth nozzle may also be the first active nozzle, where all of the nozzles closer to the second end 203 (i.e., the first twelve nozzles) are inactive.

In the orientation shown in FIG. 3, the reference nozzle 150a of the first dispenser 122a, using a polar coordinate system, is located at a position of Ra,Θa, where Ra is from 0.2 R to 0.4 R, more preferably 0.307 R and Θa is from 269° to 271°, more preferably 270°. The longitudinal axis 152a of the first dispenser 122a extends parallel to the to the 90°-270° axis (vertical axis 156) and may be aligned adjacent to the to the 90°-270° axis (vertical axis 156). The reference nozzle 150b of the second dispenser 122b is located at a position of Rb,Θb, where Rb is from 0.1 R to 0.4 R, more preferably 0. R and Θb is from 170° to 190°, more preferably 180°. The longitudinal axis 152b of the second dispenser 122b extends parallel to the 180°-0° axis (horizontal axis 154) and may be aligned adjacent to the 180°-0° axis (horizontal axis 154). The reference nozzle 150c of the third dispenser 122c is located at a position of Rc,Θc, where Rc is from less than 0.5 R to more than 0.6 R, more preferably 0.543 R and Θc is from 80° to 100°, more preferably 90°. The longitudinal axis 152c of the third dispenser 122c extends parallel to the to the 90°-270° axis (vertical axis 156) and may be aligned adjacent to the 90°-270° axis (vertical axis 156).

As a result of this configuration, in the embodiment of FIG. 3, the longitudinal axis 152a of the first dispenser 122a is non-coaxial with the longitudinal axis 152b of the second dispenser 122b and is also non-coaxial with the longitudinal axis 152c of the third dispenser 122c. Similarly, the longitudinal axis 152b of the second dispenser 122b is non-coaxial with the longitudinal axis 152c of the third dispenser 122c. Thus, all three of the dispenser 122a, 122b, 122c are non-coaxial with each other. In addition to being non-coaxial, as shown in FIG. 3, the longitudinal axis 152a of the first dispenser 122a is also angled relative to the longitudinal axis 152b of the second dispenser 122b. The angle between the longitudinal axis 152a of the first dispenser 122a and the longitudinal axis 152b of the second dispenser 122b may be 90°±1°. However, as shown in FIG. 3, while being non-coaxial, the longitudinal axis 152a of the first dispenser 122a is not angled relative to the longitudinal axis 152c of the third dispenser 122c. That is, the longitudinal axis 152a of the first dispenser 122a is parallel to the longitudinal axis 152c of the third dispenser 122c. Thus, in addition to being non-coaxial, as shown in FIG. 3, the longitudinal axis 152b of the second dispenser 122b is also angled relative to the longitudinal axis 152c of the third dispenser 122c. The angle between the longitudinal axis 152b of the second dispenser 122b and the longitudinal axis 152c of the third dispenser 122c may be 90°±5°.

FIG. 4 shows a schematic plan view of a second example embodiment of the plurality of dispensers 122 arranged relative to the substrate 102. In the example embodiment of FIG. 4, the plurality of dispensers 122 includes the first dispenser 122a, the second dispenser 122b, and the third dispenser 122c. As with FIG. 3, the position of each dispenser 122a, 122b, 122c relative to the surface of the substrate 102 is defined herein with respect to the location of a reference nozzle 150a, 150b, 150c, and the angle of the longitudinal axis 152a, 152b, 152c relative to the vertical axis 156 and horizontal axis 154 of the substrate 102. The dispensers 122a, 122b, 122c including the reference nozzles 152a, 152b, 152c are the same as in FIG. 3.

In the orientation shown in FIG. 4, the reference nozzle 150a of the first dispenser 122a is located at a position of Ra,Θa, where Ra is from 0.2 R to 0.3 R, more preferably 0.235 R and Θa is from 269° to 271°, more preferably 269.94°. The longitudinal axis 152a of the first dispenser 122a similarly extends parallel to the to the 90°-270° axis (vertical axis 156) and adjacent to the to the 90°-270° axis (vertical axis 156). The reference nozzle 150b of the second dispenser 122b is located at a position of Rb,Θb, where Rb is from 0.5 R to 0.7 R, more preferably 0.624 R and Θb is from 280° to 300°, more preferably 289.07°. The longitudinal axis 152b of the second dispenser 122b extends parallel to the to the 90°-270° axis (vertical axis 156). The reference nozzle 150c of the third dispenser 122c is located at a position of Rc,Θc, where Rc is from 0.9 R to 1.1 R, more preferably 1.067 R and Θc is from 260° to 280°, more preferably 269.13°. The longitudinal axis 152c of the third dispenser 122c extends parallel to the to the 90°-270° axis (vertical axis 156) and adjacent to the to the 90°-270° axis (vertical axis 156).

As a result of this configuration, in the embodiment of FIG. 4, the longitudinal axis 152a of the first dispenser 122a is non-coaxial with the longitudinal axis 152b of the second dispenser 122b. Similarly, the longitudinal axis 152b of the second dispenser 122b is non-coaxial with the longitudinal axis 152c of the third dispenser 122c. However, unlike the embodiment of FIG. 3, in the embodiment of FIG. 4, the longitudinal axis 152a of the first dispenser 122a may be coaxial with the longitudinal axis 152c of the third dispenser 122c. Furthermore, in the embodiment of FIG. 4, none of the longitudinal axes 152a, 152b, 152c are angled relative to each other. That is, the longitudinal axis 152a of the first dispenser is parallel to the longitudinal axis 152b of the second dispenser 122b and is parallel to the longitudinal axis 152c of the third dispenser 122c. Likewise, the longitudinal axis 152b of the second dispenser 122b is parallel to the longitudinal axis 152c of the third dispenser 122c. In other words, in the embodiment of FIG. 4, none of the longitudinal axes 152a, 152b, 152c are angled relative to each other, i.e., the angle between any of the longitudinal axes 152a, 152b, 152c to any other of the longitudinal axes 152a, 152b, 152c is about 0°±5°, preferably 0°.

Additionally, the relative positions of the first dispenser 122a, the second dispenser 122b, and the third dispenser 122c are selected such that some or all of the above-discussed first subset of nozzles 230 and/or the third subset of nozzles 234 (i.e., the nozzles that are controlled by the controller 140 to not dispense fluid during a dispensing operation) of each dispenser is radially aligned with the second subset of nozzles 232 (i.e., the nozzles that are controlled by the controller 140 to dispense fluid during a dispensing operation) of one or both of the other dispensers. In other words, one or more, preferably all, of the nozzles of any particular dispenser that will not be used to dispense fluid during the dispensing operation may be radially aligned with nozzles from another dispenser that will be dispensing fluid during the dispensing operation. For example a portion or all of the first subset of nozzles 230 or third subset of nozzles 234 of the first dispenser 122a may be radially aligned with the second subset of nozzles 232 of the second dispenser 122b and/or the second subset of nozzles 232 of the third dispenser 122c, a portion or all of the first subset of nozzles 230 or third subset of nozzles 234 of the second dispenser 122b may be radially aligned with the second subset of nozzles 232 of the first dispenser 122a and/or the second subset of nozzles 232 of the third dispenser 122c, and/or a portion or all of the first subset of nozzles 230 or third subset of nozzles 234 of the third dispenser 122c may be radially aligned with the second subset of nozzles 232 of the first dispenser 122a and/or the second subset of nozzles 232 of the second dispenser 122b. Such a configuration ensures that there are no "dead zones", i.e., no portions of the substrate surface that only have non-used nozzles overhead.

Figure 5:
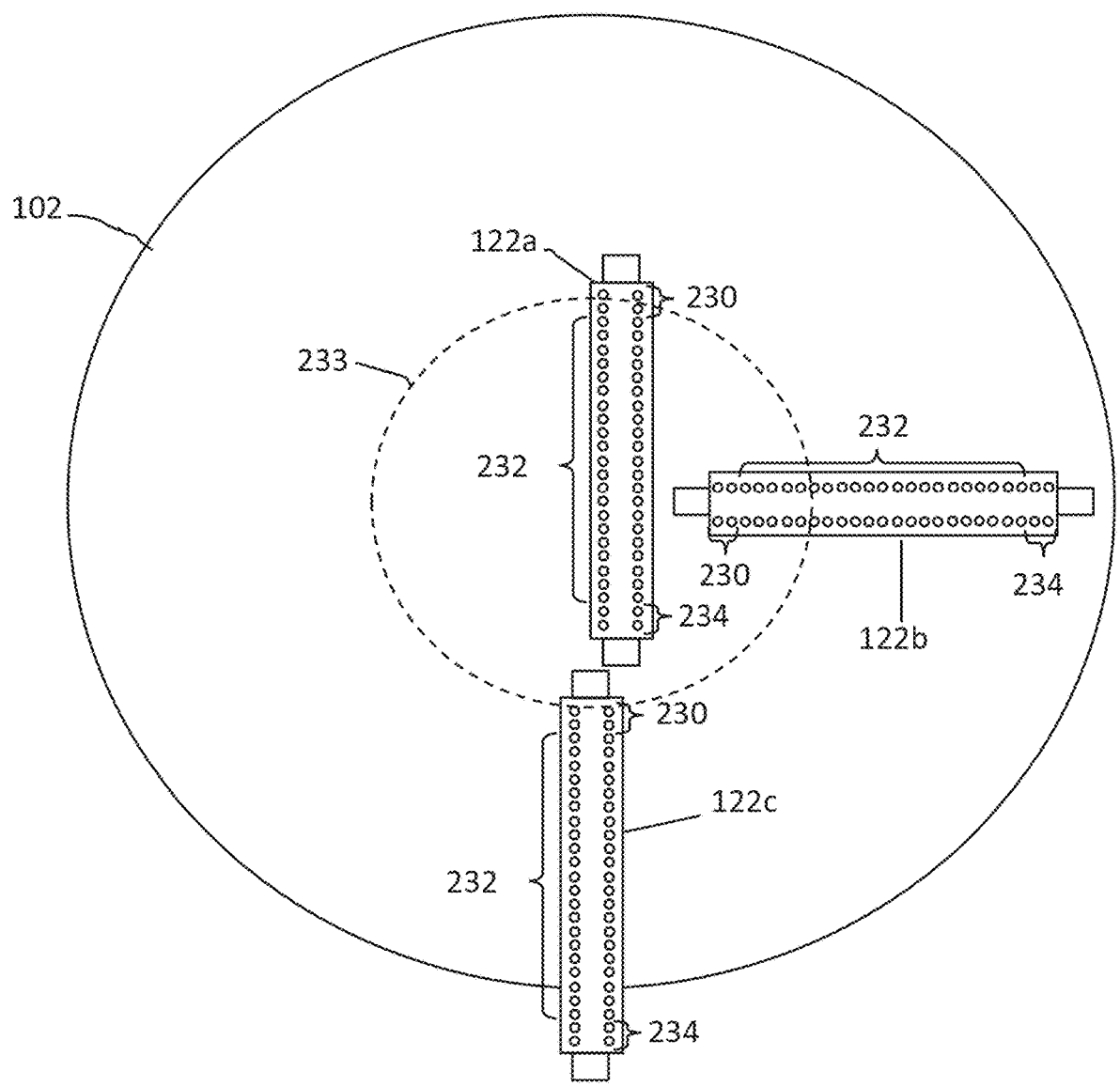
FIG. 5 shows a schematic plan view of embodiment of FIG. 3 showing an example radial alignment of nozzles in accordance with an example embodiment.

FIG. 5 is a schematic plan view of the orientation of FIG. 3 in which the radial alignment of non-used nozzles with used nozzles is shown. As shown in FIG. 5, the first subset of nozzles 230 of the first dispenser 122a are radially aligned with the second subset of nozzles 232 of the second dispenser 122b indicated by the radial alignment circle 233. While only one radial alignment circle is illustrated in FIG. 5 for simplicity, other non-used nozzles such as the first subset of nozzles 230 of the third dispenser 122c is radially aligned with second subset of nozzles 232 of the second dispenser 122b. Furthermore, although not illustrated, the radial alignment circles could also be applied to the embodiment of FIG. 4.

While three dispensers are illustrated above in two example embodiments, additional dispensers may be used to in some embodiments to improve the dispensing. For example, four or five dispensers may be used in some embodiments even when the ratio of the diameter of the substrate to the length of the dispensers is the same as provided above. Any more than five dispensers may become too difficult to physically mount, as noted above. In yet another embodiment, only two dispensers may be used. In an embodiment where only two dispensers are used, the ratio of the diameter of the substrate to the length of the dispenser is smaller than the ratio described above such that two dispensers is sufficient to cover the entire surface of the substrate.

In each of the embodiments shown in FIGS. 3 and 4, each of the dispensers 122a, 122b, 122c are mounted to the dispenser head 123 so that the dispensers 122a, 122b, 122c have the illustrated orientation relative to each other. Then, prior to the dispensing operation, the dispenser head 123 carrying the dispensers 122a, 122b, 122c is positioned over the substrate 102 so that the dispensers 122a, 122b, 122c are located at the positions shown in FIG. 3 or FIG. 4 relative to the substrate 102. During the dispensing operation, the controller 140 controls the rotation mechanism 125 to rotate either the dispensers 122a, 122b, 122c or the substrate 102 about the rotation axis 127, the rotation axis 127 passing through the center point 151 of the substrate 102.

Figure 6A:
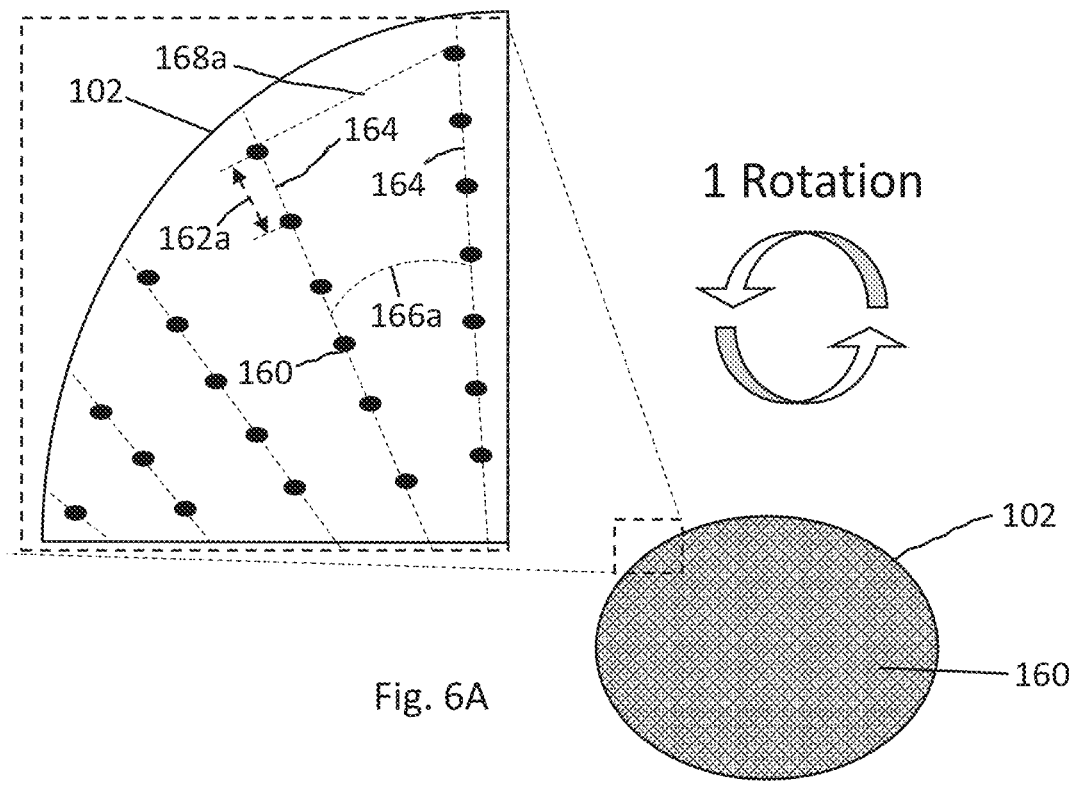
FIG. 6A shows a substrate having a plurality of drop positions and includes an expanded portion showing a radial pitch in accordance with an example embodiment.

The above-described nozzle structure of the plurality of dispensers 122, along with the ability of the system to rotate the substrate 102 or rotate the plurality of dispensers 122 about the rotation axis 127, determines the size of the radial pitch of dispensed drops during a dispensing operation. The radial pitch is a distance from the center of a potential droplet position to the center of the next possible adjacent droplet in a radial direction. FIG. 6A illustrates a schematic representation of potential drop locations dispensed on a substrate 102 in a case where the above-described plurality of dispensers 122 are used to dispense fluid during a single complete (360 degree) rotation of either the plurality of dispensers 122 or the substrate 102. FIG. 6A shows a substrate 102 having a plurality of potential drop positions 160, including an expanded portion showing a radial pitch 162a (i.e., the distance between individual potential drop dispensing positions along a common radial line 164). In the embodiment shown in FIG. 6A, the radial pitch 162a is one-half of the distance 210 between adjacent nozzles in the Y-dimension (FIG. 2C). This is a result of the structural layout of the nozzles described above, where the second row of nozzles 204 is offset by a distance 216 that is one-half the distance 210 relative to the first row of nozzles 202. That is, if the nozzles of both rows 202, 204 are used to dispense fluid during a single full rotation, because of the offset between rows and the distance between nozzles in the Y-dimension, the closest any two adjacent drops can potentially be to each other along a common radial line is one-half the distance 210.

The angular pitch 166a is determined by the rotational speed of the dispensers 122 or the substrate 102 and the frequency at which the dispensers 122 dispense drops of fluid. The angular pitch 166a is the angle between two adjacent radial lines 164 along which drops can be dispensed. The slower the rotation and the faster the dispensers 122 can dispenser fluid, the smaller the angle there will be between radial lines 164. The limitations on the angular pitch is therefore not limited by the nozzle structure, but rather is limited by how slow the rotation mechanism can rotate the dispensers 122 or the substrate 102 and how fast the dispensers 122 can dispenses fluid. Therefore, the angular pitch is variable and can be controlled by increasing or decreasing the rotation speed and/or increasing and decreasing the dispensing frequency at predetermined times during the rotation. For the same reason, the density of drops dispensed can be increased or decreased by increasing or decreasing the rotation speed and/or increasing and decreasing the dispensing frequency at predetermined times during the rotation. The angular pitch 166a may be from 0.05 degrees to 0.06 degrees. In one example embodiment, due to the mechanical limitations of the rotating mechanism and the dispensing frequency, the smallest possible angular pitch achievable corresponds to a distance 168a between drop positions on two adjacent radial lines at the edge of the substrate 102 that is one-half the distance 210.

Figure 6B:
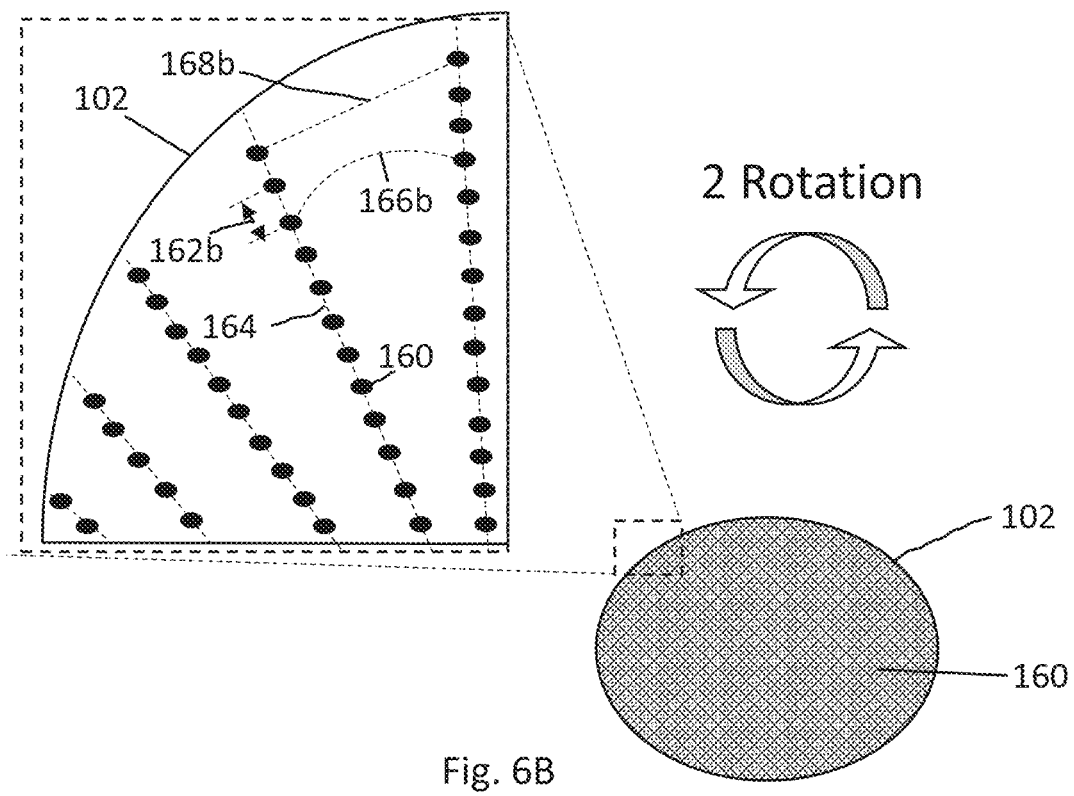
FIG. 6B shows a substrate having a plurality of drop positions and including an expanded portion showing a radial pitch in accordance with another example embodiment.

FIG. 6B illustrates a schematic representation of potential drop locations dispensed on a substrate 102 in a case where the above-described plurality of dispensers 122 are used to dispense fluid during two complete (360 degree) rotations of either the plurality of dispensers 122 or the substrate 102. In this embodiment, after performing a dispensing and completing a first full rotation, the substrate 102 or the dispensers 122 may be translated in the X, Y, or radial dimensions by one-fourth the distance 210 between adjacent nozzles in the Y-dimension. That is, after the first rotation is completed, the rotation axis 127 is moved by one-fourth the distance 210 relative to the position in the first rotation dispensing. At the second location, another dispensing operation occurs with a second full rotation. FIG. 6B shows the substrate 102 having a plurality of drop positions 160 and including an expanded portion showing a radial pitch 162b (i.e., the distance between individual potential drop positions along a common radial line 164). In the embodiment shown in FIG. 6B, due to the movement of the rotation axis and the second dispensing, the radial pitch 162b is one-fourth of the distance 210 between adjacent nozzles in the Y-dimension, i.e., one-half the radial pitch 162a. This is a result of the structural layout of the nozzles described above, where the second row of nozzles 204 is offset by a distance 216 that is one-half the distance 210 relative to the first row of nozzles 202 combined with the movement of the rotation axis 127 by one-fourth the distance 210. That is, as in the embodiment of FIG. 6A, if the nozzles of both rows 202, 204 are used to dispense fluid during a single full rotation, because of the offset between rows and the distance between nozzles, the closest any two adjacent drops can potentially be to each other is one-half the distance 210. However, because the of movement of the rotation axis 126 by one-fourth the distance 210, the same dispensers can further dispense drops during the second dispensing that are halfway between the one-half of the distance 210 of the first dispensing. Accordingly, the overall dispensing process moving the rotations axis 127 and performing a second dispensing allows for the radial pitch 162*b* that is one-fourth the distance 210 and one-half radial pitch 162*a*.

The angular pitch 166*b* in the embodiment of FIG. 6B is the same as in the embodiment of FIG. 6A. That is, moving the rotation axis 127 and performing the first dispensing does not impact the angle between two adjacent radial lines 164. Accordingly, in addition to the angular pitch 166*b* being the same as the angular pitch 166*a*, the smallest possible angular pitch achievable in the embodiment of FIG. 6B also corresponds to a distance 168*b* between drop positions on two adjacent radial lines at the edge of the substrate 102 that is one-fourteenth the distance 210.

In another embodiment, the possible drop positions may be further modified from what is shown in FIG. 6B such that the angular pitch is ½ the size of the angular pitch 166*b*. This can be achieved by offsetting the timing of the dispensing during the second rotation as compared to the first rotation. For example, during the first rotation, the dispensing may occur at with a set minimum period (i.e., dispense at multiple of a period t). However, during the second rotation, while the same minimum dispensing period is used as in the first rotation (i.e., dispense at a multiple of the period t), the start of the dispensing in the second rotation may be offset by half the period ½t. For example, if the final dispensing of the first rotation occurs at time A, then the first dispensing of the second rotation will occur at either A+0.5t or A+1.5t (or multiple thereof). As a result of the timing offset, the drops dispensed during the second rotation are placed halfway between the angular pitch of FIG. 6B.

Planarizing/Imprinting Process

Figure 7:
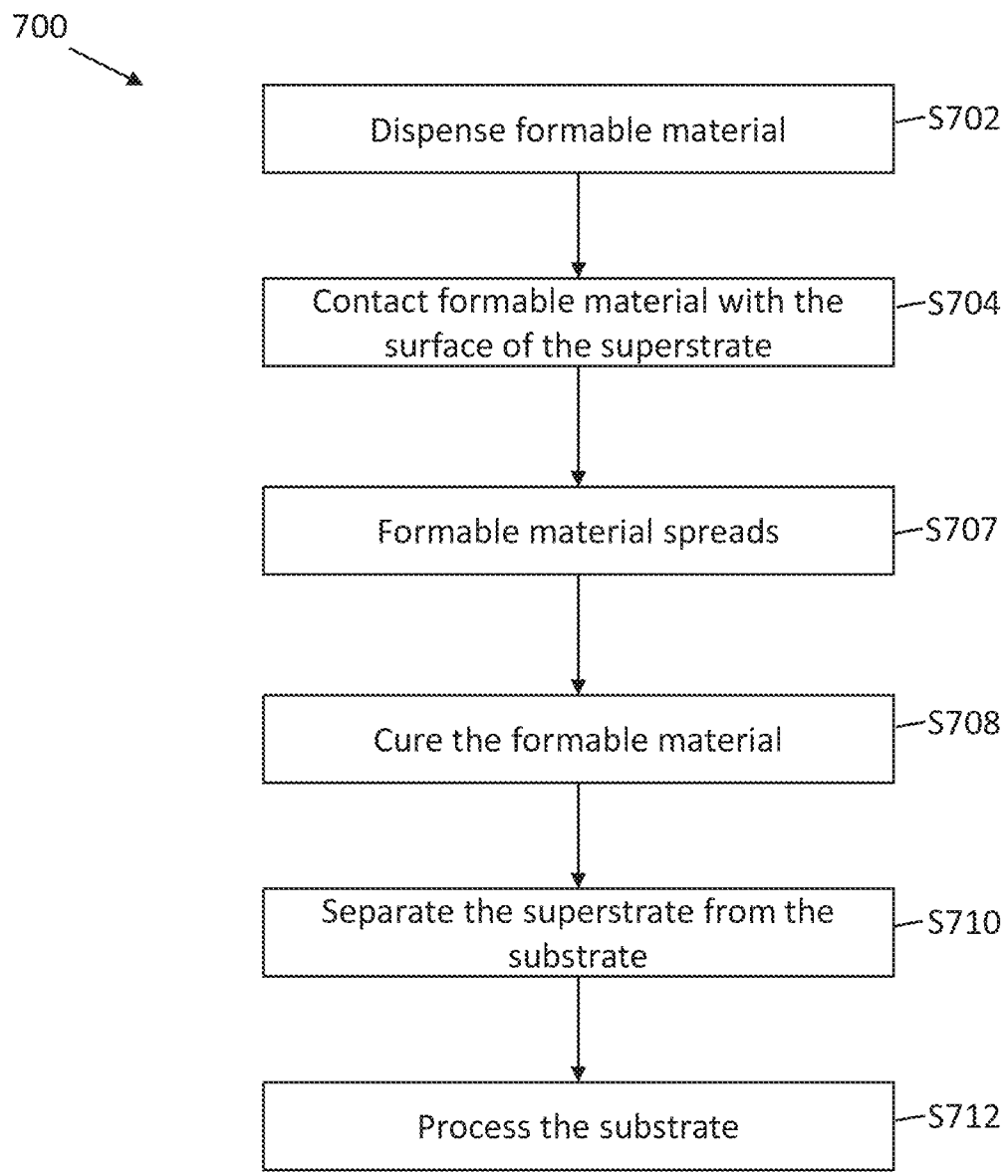
FIG. 7 is a flowchart of a planarizing process using the planarization system of FIG. 1.

FIG. 7 is a flowchart of an planarizing process 700 using the planarization system 100 that can be used to planarize formable material 124 on the substrate 102. The planarizing process 700 may be performed repeatedly on a plurality of substrates 102 using the planarization system 100. The processor 140 may be used to control the planarizing process 700. In an alternative embodiment, in case of nanoimprinting, a similar process may be performed to form patterns of formable material 124 on the substrate 102. In the case of forming patterns, substantially the same steps discussed herein with respect to FIG. 7 are performed, except that a patterned template is used in place of the patternless superstrate. Thus, it should be understood that the following description is also applicable to an imprinting method. Where difference do occur, they are noted below.

The beginning of the planarizing process 700 may include a superstrate mounting step causing a superstrate conveyance mechanism to mount a superstrate 108 onto the superstrate chuck 118. The planarizing process 700 may also include a substrate 102 mounting step. The processor 140 may cause a substrate conveyance mechanism to mount the substrate 102 onto the substrate chuck 104. The substrate 102 may have one or more coatings and/or structures. The order in which the superstrate 108 and the substrate 102 are mounted onto the planarization system 100 is not particularly limited, and the superstrate 108 and the substrate 102 may be mounted sequentially or simultaneously. In the case of nanoimprinting, a template with patterned surface is used in place of the superstrate.

In a positioning step, the processor 140 may cause one or both of the substrate positioning stage 106 and/or a dispenser positioning stage to move the substrate 102 to a fluid dispense position below the plurality of fluid dispensers 122. As noted above, the dispensing may occur at a dispensing system 103 separate from the planarizing system 105. Prior to the start of dispensing, the plurality of dispensers 122 may be oriented above the substrate 102 such that the entire surface area of the substrate is covered by nozzles from which formable material will be dispensed. Preferably, the plurality of dispensers 122 include the first dispenser 122*a*, the second dispenser 122*b*, and the third dispenser 122*c* being oriented in the manner discussed above and shown in the example embodiment of FIG. 3 or the example embodiment of FIG. 4.

In a dispensing step S702, the processor 140 may cause the fluid dispenser 122 to dispense formable material onto the substrate 102 as the rotation mechanism 125 rotates either the plurality of dispensers 122 or the substrate 102. In an embodiment, during the dispensing step S702, the formable material 124 may be dispensed onto a substrate in accordance with a drop pattern. The drop pattern may include information such as one or more of the positions to deposit drops of formable material, the volume of the drops of formable material, type of formable material, shape parameters of the drops of formable material, etc. Generating a drop pattern may include a processor 140 receiving a substrate pattern of a representative substrate 102. The substrate pattern may include information about substrate topography of the representative substrate. The substrate topography may be measured, generated based on previous fabrication steps and/or generated based on design data. In an alternative embodiment, the substrate pattern is featureless either because there were no previous fabrication steps or the substrate had previously been planarized to reduce topography. The substrate topography may include information about the shape of an edge such as a beveled edge or a rounded edge of the representative substrate. The substrate topography may include information about the shape and position of one or more flats or notches which identify the orientation of the substrate. The substrate topography may include information about a shape and position of a reference edge which surrounds the area of the substrate on which patterns are to be formed. Once the substrate pattern is received, a processor 140 may calculate a distribution of formable material 124 that will produce a film that fills the volume between the substrate and the superstrate surface when the substrate and the superstrate surface are separated by a gap during planarizing. The distribution of formable material on the substrate may take the form of: an areal density of formable material; positions of droplets of formable material; and/or volume of droplets of formable material. Calculating the distribution of formable material may take into account one or more of: material properties of the formable material, material properties of the superstrate surface, material properties of the substrate surface, spatial variation in volume between the superstrate surface and the substrate surface; fluid flow, evaporation; etc.

The drop pattern may be represented by a polar grid of coordinates representing a particular location of each drop on the substrate relative to the center point 151, where the positions correspond to dispensable positions allowed by the radial and angular pitch of the dispensing system. That is, each drop of the drop pattern my correspond to a particular location having a coordinate (R,Θ) relative to the center point 151 having polar coordinate (0, 0), where each location is dispensable by the dispensing system. For example, in the embodiment of FIG. 6A where there is only one rotation, the drop pattern may include any combination of drop positions that are within the radial pitch 162*a* and the angular pitch 166*a*, while in the embodiment of FIG. 6B where there are two rotations, the drop pattern may include any combination of drop positions that are within the radial pitch 162b and the angular pitch 166b. In this manner, the dispensing system can dispense a wide variety of drop patterns depending on the specifications of a particular fabrication.

The dispensing step S702 may include dispensing a plurality of drops onto the substrate 102 according to the drop pattern as either the plurality of dispensers 122 or the substrate 102 rotates about the rotation axis 127. The timing of the rotation and the position of the nozzles of the dispensers during the rotation at a moment in time are coordinated such that the drops will be dispensed according to the drop pattern across the surface of the substrate. As discussed above with respect to FIG. 6A, in the example embodiment where the dispensers having the nozzle geometry shown in FIGS. 2A to 2E and there is only one full rotation of the dispensers or substrate, the maximum possible density of drops is limited by the rotation speed and the geometry of the nozzles. That is, as noted above, in this embodiment, the radial pitch 162a is one-half of the distance 410 between adjacent nozzles in the Y-dimension for one full rotation about the rotation axis 127. Thus, when a lower density of drops in a radial direction is acceptable (i.e., where a drop pattern being dispensed during the rotation can be satisfied using the larger radial pitch of FIG. 6A), one full rotation is sufficient to dispense all of the drops of the drop pattern using the plurality of dispensers 122. In this embodiment after the drops have been dispensed according to the drop pattern during the one full rotation, the dispensing step S702 is complete.

As discussed above with respect to FIG. 6B, in the example embodiment where the dispensers have the nozzle geometry shown in FIGS. 2A to 2E, and when there are two full rotations of the dispensers or substrate separated by a moving of the rotation axis 127 by one-fourth the distance 210, the radial pitch 162a is one-fourth of the distance 210 between adjacent nozzles in the Y-dimension. Thus, when it desirable to have a higher density of drops along a radial direction (i.e., where a drop pattern being dispensed during the rotation requires the smaller relative pitch of FIG. 6B), the dispensing step S702 may include: 1) a first dispensing of drops during a first rotation of the plurality of dispenser or substrate, 2) moving the rotation axis 127 by one-fourth the distance 210 after completing the first dispensing, and 3) a second dispensing of drops during a second rotation after moving the rotation axis. In this embodiment after the drops have been dispensed according to the drop pattern during the second full rotation, the dispensing step S702 is complete.

After, the droplets are dispensed, then a contacting step S704 may be initiated, the processor 140 may cause one or both of the substrate positioning stage 106 and a superstrate positioning stage to bring the superstrate surface 112 of the superstrate 108 into contact with the formable material 124. As noted above, planarizing system 105 may be located at a different location than the dispensing system 103. In this case, the substrate having the formable material 124 dispensed thereon is first carried to the planarization system 105. Once the substrate 102 having the formable material dispensed on the surface is properly positioned underneath the superstrate 108, the contacting step S704 may be performed. In a case of nanoimprinting the same steps are performed, except that a template having a patterned surface is contacted with the formable material. Furthermore, while the superstrate is generally the same size or larger than the substrate, the template may be much smaller than the substrate. Thus, in the case of nanoimprinting, some steps are repeated as discussed further below. Additionally, the drop pattern will be generated based on similar factors noted above, but would also be based on the template topography.

During a spreading step S706, the formable material 124 then spreads out towards the edge of the substrate 102. How the formable material 124 spreads can be observed via the field camera 136 and may be used to track a progress of a fluid front of formable material.

In a curing step S708, the processor 140 may send instructions to the radiation source 126 to send a curing illumination pattern of actinic radiation through the superstrate 108 and the superstrate surface 112. The curing illumination pattern provides enough energy to cure (polymerize) the formable material 124 under the superstrate surface 112.

In a separation step S710, the processor 140 uses one or more of the substrate chuck 104, the substrate positioning stage 106, superstrate chuck 118, and the planarizing head 120 to separate the superstrate surface 112 of the superstrate 108 from the cured formable material on the substrate 102. Because the superstrate 108 is generally the same size or larger than the substrate, after this step the entire substrate has been planarized and cured and none of the above steps need to be repeated. However, in the case of nanoimprinting, where the patterned template is generally much smaller than the substrate, after the separation step S710, the method may return to the contacting step S704. The template may move to another location (or field) on the substrate, where the template is again contacted with a different portion of formable material. The formable material will spread and the curing step is performed again following the spread at this new location/field. The steps of contacting, curing, spreading, and separating may be repeated on a field by field basis until the entire substrate has been imprinted.

The substrate may then be processed in step S712. The processing step S712 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

The dispensing and nanofabrication systems described above, used to perform the dispensing and nanofabrication methods described above, solves the above-noted disadvantage of known nanofabrication system/methods. In particular, the plurality of dispensers, having the above-described arrangement relative to each other and relative to the substrate allows for dispensing of formable material using relatively few dispensers (e.g., two or three) and relatively few rotations (e.g., one or two). Thus, the above-described dispensing and nanofabrication systems avoids the structural difficulty of many dispensers and avoids the dispensing time increase of many passes.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A dispensing system, comprising:
 a first dispenser including:
  a first end;
  a second end;

a longitudinal axis extending through the first end of the first dispenser and the second end of the first dispenser; and a set of nozzles arranged about the longitudinal axis of the first dispenser, the set of nozzles of the first dispenser including a first subset of nozzles and a second subset of nozzles, the second subset of nozzles being closer to the second end of the first dispenser than the first subset of nozzles;

a second dispenser including:
 a first end;
 a second end;
 a longitudinal axis extending through the first end of the second dispenser and the second end of the second dispenser; and
 a set of nozzles arranged about the longitudinal axis of the second dispenser, the set of nozzles of the second dispenser including a first subset of nozzles and a second subset of nozzles, the second subset of nozzles being closer to the second end of the second dispenser than the first subset of nozzles;

a substrate chuck; and a rotation mechanism configured to rotate the substrate chuck around a rotation axis or configured to rotate the first dispenser and the second dispenser around the rotation axis, wherein a portion of the first subset of nozzles of the first dispenser is radially aligned around the rotation axis with the second subset of nozzles of the second dispenser, and wherein the first dispenser is positioned relative to the second dispenser such that the longitudinal axis of the first dispenser is non-coaxial with the longitudinal axis of the second dispenser.

2. The dispensing system of claim 1, wherein the first dispenser is positioned relative to the second dispenser such that the longitudinal axis of the first dispenser is angled relative to the longitudinal axis of the second dispenser.

3. The dispensing system of claim 2, wherein the angle of the longitudinal axis of the first dispenser relative to the longitudinal axis of the second dispenser is about 90°.

4. The dispensing system of claim 1, wherein the first dispenser is positioned relative to the second dispenser such that the longitudinal axis of the first dispenser is parallel relative to the longitudinal axis of the second dispenser.

5. The dispensing system of claim 1, further comprising a third dispenser including:
 a first end;
 a second end;
 a longitudinal axis extending through the first end of the first dispenser and the second end of the third dispenser; and
 a set of nozzles arranged about the longitudinal axis of the third dispenser.

6. The dispensing system of claim 5, wherein the third dispenser is positioned relative to the second dispenser such that the longitudinal axis of the third dispenser is non-coaxial with the longitudinal axis of the second dispenser.

7. The dispensing system of claim 6, wherein the third dispenser is positioned relative to the second dispenser such that the longitudinal axis of the third dispenser is angled relative to the longitudinal axis of the second dispenser.

8. The dispensing system of claim 7, wherein the angle of the longitudinal axis of the third dispenser relative to the longitudinal axis of the second dispenser is about 90°.

9. The dispensing system of claim 7, wherein the first dispenser is positioned relative to the third dispenser such that the longitudinal axis of the first dispenser is parallel relative to the longitudinal axis of the third dispenser.

10. The dispensing system of claim 6, wherein the second dispenser is positioned relative to the third dispenser such that the longitudinal axis of the second dispenser is parallel relative to the longitudinal axis of the third dispenser.

11. The dispensing system of claim 10, wherein the first dispenser is positioned relative to the third dispenser such that the longitudinal axis of the second dispenser is coaxial with the longitudinal axis of the third dispenser.

12. The dispensing system of claim 5, wherein the rotation mechanism is configured to rotate the substrate chuck about the rotation axis or configured to rotate the first dispenser, the second dispenser, and the third dispenser about the rotation axis.

13. The dispensing system of claim 1, wherein the rotation mechanism is configured to rotate the substrate chuck about the rotation axis.

14. The dispensing system of claim 1, wherein the rotation mechanism is configured to rotate the first dispenser and the second dispenser about the rotation axis.

15. The dispensing system of claim 1,
 wherein each of the set of nozzles of the first dispenser and the set of nozzles of the second dispenser includes a plurality of nozzles configured to dispense formable material and one or more nozzles that are configured to not dispense the formable material, and
 wherein a portion of the plurality of nozzles of the first dispenser configured to dispense formable material are radially aligned around the rotation axis with the one or more nozzles of the second dispenser that are configured to not dispense the formable material.

16. The dispensing system of claim 1, wherein a ratio of a number of nozzles of the first subset of nozzles of the first dispenser to a number of nozzles of the second subset of nozzles of the second dispenser is 1:10 to 1:20.

17. The dispensing system of claim 1, further comprising a substrate,
 wherein the first dispenser has a length L1 extending from the first end of the first dispenser to the second end of the first dispenser,
 wherein the second dispenser has a length L2 extending from the first end of the second dispenser to the second end of the second dispenser,
 wherein the substrate has a diameter D, and
 wherein a ratio of D:L1 and a ratio of D:L2 are each 5:1 to 2:1.

18. A nanofabrication system, comprising:
 a substrate chuck configured to hold a substrate;
 a superstrate or a template;
 a positioning stage;
 a dispensing system configured to dispense formable material on the substrate, the dispensing system comprising:
  a first dispenser including:
   a first end;
   a second end;
   a longitudinal axis extending through the first end of the first dispenser and the second end of the first dispenser; and
   a set of nozzles arranged about the longitudinal axis of the first dispenser, the set of nozzles of the first dispenser including a first subset of nozzles and a second subset of nozzles, the second subset of nozzles being closer to the second end of the first dispenser than the first subset of nozzles;

a second dispenser including:
  a first end;
  a second end;
  a longitudinal axis extending through the first end of the second dispenser and the second end of the second dispenser; and
  a set of nozzles arranged about the longitudinal axis of the second dispenser, the set of nozzles of the second dispenser including a first subset of nozzles and a second subset of nozzles, the second subset of nozzles being closer to the second end of the second dispenser than the first subset of nozzles,
wherein the first dispenser is positioned relative to the second dispenser such that the longitudinal axis of the first dispenser is non-coaxial with the longitudinal axis of the second dispenser;
a rotation mechanism configured to rotate the substrate chuck around a rotation axis or configured to rotate the first dispenser and the second dispenser around the rotation axis during dispensing of the formable material, wherein a portion of the first subset of nozzles of the first dispenser is radially aligned around the rotation axis with the second subset of nozzles of the second dispenser;
a positioning system configured to contact the formable material with the superstrate or template; and
a curing system configured to cure the formable material under the superstrate or template so as to form cured formable material on the substrate.

19. A method of manufacturing an article, comprising:
dispensing a formable material onto a substrate using a dispensing system, the dispensing system comprising:
  a first dispenser including:
    a first end;
    a second end;
    a longitudinal axis extending through the first end of the first dispenser and the second end of the first dispenser; and
    a set of nozzles arranged about the longitudinal axis of the first dispenser, the set of nozzles of the first dispenser including a first subset of nozzles and a second subset of nozzles, the second subset of nozzles being closer to the second end of the first dispenser than the first subset of nozzles;
  a second dispenser including:
    a first end;
    a second end;
    a longitudinal axis extending through the first end of the second dispenser and the second end of the second dispenser; and
    a set of nozzles arranged about the longitudinal axis of the second dispenser, the set of nozzles of the second dispenser including a first subset of nozzles and a second subset of nozzles, the second subset of nozzles being closer to the second end of the second dispenser than the first subset of nozzles,
  wherein the first dispenser is positioned relative to the second dispenser such that the longitudinal axis of the first dispenser is non-coaxial with the longitudinal axis of the second dispenser;
during the dispensing, rotating a substrate chuck holding the substrate around a rotation axis or rotating the first dispenser and the second dispenser around the rotation axis, wherein a portion of the first subset of nozzles of the first dispenser is radially aligned around the rotating axis with the second subset of nozzles of the second dispenser,
contacting a superstrate or template with the formable material dispensed on the substrate;
curing the formable material;
separating the superstrate or template from the cured formable material; and
processing the cured formable material to make the article.

* * * * *